(12) United States Patent
Kim et al.

(10) Patent No.: US 10,278,300 B2
(45) Date of Patent: Apr. 30, 2019

(54) DISPLAY DEVICE

(71) Applicant: SAMSUNG DISPLAY CO., LTD., Yongin-si, Gyeonggi-do (KR)

(72) Inventors: Chang-hoi Kim, Gwangmyeong-si (KR); Kyounghun Shin, Yongin-si (KR); Woongjae Chang, Asan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/473,816

(22) Filed: Mar. 30, 2017

(65) Prior Publication Data

US 2017/0374754 A1    Dec. 28, 2017

(30) Foreign Application Priority Data

Jun. 28, 2016    (KR) ........................ 10-2016-0081055

(51) Int. Cl.

| G06F 1/16 | (2006.01) |
| H05K 5/00 | (2006.01) |
| H05K 7/00 | (2006.01) |
| H05K 5/02 | (2006.01) |
| F16M 11/16 | (2006.01) |
| F16M 11/22 | (2006.01) |
| H04N 5/64 | (2006.01) |

(52) U.S. Cl.
CPC ........... *H05K 5/0234* (2013.01); *F16M 11/16* (2013.01); *F16M 11/22* (2013.01); *G06F 1/1632* (2013.01); *H04N 5/64* (2013.01); *H05K 5/0017* (2013.01); *F16M 2200/08* (2013.01); *H04N 5/642* (2013.01)

(58) Field of Classification Search
CPC .... G06F 1/1601; G06F 1/1605; G06F 1/1607; G06F 1/1632; G06F 1/1652; G06F 1/1654; G06F 1/1637; H05K 5/0234; H05K 5/0017
USPC ............... 361/679.41–679.44, 679.21–679.3, 361/679.55–679.56
See application file for complete search history.

(56) References Cited

U.S. PATENT DOCUMENTS

| 5,627,727 A * | 5/1997 | Aguilera ............... G06F 1/1626 361/679.43 |
| 2004/0052037 A1* | 3/2004 | Sawyer ................. G06F 1/1601 361/679.05 |
| 2006/0250764 A1 | 11/2006 | Howarth et al. |
| 2008/0026803 A1 | 1/2008 | Demuynck |

(Continued)

FOREIGN PATENT DOCUMENTS

| JP | 2013-190576 A | 9/2013 |
| KR | 10-2005-0054719 A | 6/2005 |

(Continued)

*Primary Examiner* — Anthony M Haughton
(74) *Attorney, Agent, or Firm* — Lee & Morse P.C.

(57) ABSTRACT

A display device includes a curved display module to receive a control signal to display an image, a stand including an electric module to provide the control signal, and a stand housing accommodating the display module in a curved coupling groove, a first coupling unit including a first module to receive the control signal and driven by the control signal, and a first coupling housing coupled to the stand housing, and a second coupling unit including a second module to receive the control signal and driven by the control signal, and a second coupling housing coupled to the stand housing.

20 Claims, 13 Drawing Sheets

(56) References Cited

U.S. PATENT DOCUMENTS

| | | | | |
|---|---|---|---|---|
| 2012/0243718 A1* | 9/2012 | Hsu Huang | ............ | G06F 1/1605 |
| | | | | 381/333 |
| 2013/0107137 A1 | 5/2013 | Nonomura et al. | | |
| 2014/0184904 A1 | 7/2014 | Lam et al. | | |
| 2015/0286253 A1* | 10/2015 | Jung | ..................... | G06F 1/1652 |
| | | | | 361/679.3 |
| 2015/0378391 A1* | 12/2015 | Huitema | ................. | G06F 1/163 |
| | | | | 361/679.03 |
| 2016/0249471 A1 | 8/2016 | Li | | |
| 2017/0118850 A1* | 4/2017 | Kwon | ................. | H05K 5/0017 |

FOREIGN PATENT DOCUMENTS

| | | |
|---|---|---|
| KR | 10-2008-0019425 A | 3/2008 |
| KR | 10-2008-0063681 A | 7/2008 |
| KR | 10-2013-0142447 A | 12/2013 |
| KR | 10-2017-0047789 A | 5/2017 |
| WO | WO 2014/034169 A1 | 3/2014 |
| WO | WO 2016/026158 A1 | 2/2016 |

\* cited by examiner

DISPLAY DEVICE

CROSS-REFERENCE TO RELATED APPLICATION

Korean Patent Application No. 10-2016-0081055, filed on Jun. 28, 2016, in the Korean Intellectual Property Office, and entitled: "Display Device," is incorporated by reference herein in its entirety.

BACKGROUND

1. Field

The present disclosure relates to a display device, and more particularly, to a display device including a display module and a stand.

2. Description of the Related Art

A display device is used for displaying an image in information processing apparatuses such as a TV, a monitor, a laptop, and a mobile phone. A display device including a display module having a curved shape has recently been developed, as well as a display device including a flat panel type display module, and the display device including the curved display module may provide an image with improved three-dimensional effect, immersion, and presence to a viewer by providing a display area having a curved shape.

SUMMARY

An embodiment provides a display device including a display module, a stand, a first coupling unit, and a second coupling unit. The display module is in a curved form and receives a control signal to display an image. The stand accommodates an electric module providing the control signal and the display module, and includes a stand housing having a curved coupling groove. The first coupling unit includes a first module receiving the control signal and driven by the control signal and a first coupling housing coupled to the stand housing. The second coupling unit includes a second module receiving the control signal and driven by the control signal and a second coupling housing coupled to the stand housing.

In an embodiment, the display device may operate in a first mode in which the display module is accommodated in the stand or in a second mode in which the display module is withdrawn from the stand.

In an embodiment, the display device may operate in a first coupling mode in which the first coupling unit and the stand are coupled to each other or in a first decoupling mode in which the first coupling unit and the stand are decoupled from each other.

In an embodiment, the display device may operate in a second coupling mode in which the second coupling unit and the stand are coupled to each other or in a second decoupling mode in which the second coupling unit and the stand are decoupled from each other.

In an embodiment, each of the first module and the second module may be selected from among a speaker, a tuner, a computer, and a charger for electronic devices.

In an embodiment, each of the first and second modules may receive the control signal by wire or wirelessly.

In an embodiment, the stand housing may include a stand part having the coupling groove, a first coupling part coupled to the first coupling unit, and a second coupling part coupled to the second coupling unit.

In an embodiment, each of the first and second coupling parts may be selected from among a USB connector, a pogo block, and a jig block.

In an embodiment, the stand part may include a bottom part, a first sidewall portion connected to the bottom part, and a second sidewall portion contacting the bottom part and spaced from the first sidewall portion. The coupling groove may be defined by an upper surface of the bottom part, an inner surface of the first sidewall portion, and an inner surface of the second sidewall portion.

In an embodiment, the first coupling housing may include a first support part contacting at least a portion of the first module and a third coupling part coupled to the first coupling part.

In an embodiment, the third coupling part may be selected from a USB connector, a pogo block, and a jig block.

In an embodiment, the second coupling housing may include a second support part contacting at least a portion of the second module and a fourth coupling part coupled to the second coupling part.

In an embodiment, the fourth coupling part may be selected from among a USB connector, a pogo block, and a jig block.

In an embodiment, the display module may include a display panel displaying an image and a frame having at least a portion accommodated in the coupling groove and surrounding the display panel.

In an embodiment, the display module may include an image signal receiving unit receiving the image signal, and the stand may include a control signal transmitter providing the image signal.

In an embodiment, a display device includes a display module, a stand, a first coupling unit, and a second coupling unit. The display module includes a stand part having a curved coupling groove and accommodating the display module, a first coupling part provided to one end of the stand part, a second coupling part provided to the other end of the stand, and an electric module providing the control signal. The first coupling unit includes a first module driven by the provided control signal, a first support part contacting at least a portion of the first module, and a third coupling part provided to one end of the first support part and coupled to the first coupling part. The second coupling unit includes a second module driven by the provided control signal, a second support part contacting at least a portion of the second module, and a fourth coupling part provided to one end of the second support part and coupled to the second coupling part.

In an embodiment, the display device may operate in a first mode in which the display module is accommodated in the stand or in a second mode in which the display module is withdrawn from the stand.

In an embodiment, the display device may operate in a first coupling mode in which the first and third coupling parts are coupled to each other, or in a first decoupling mode in which the first and third coupling parts are decoupled from each other.

In an embodiment, the display device may operate in a second coupling mode in which the second and fourth coupling parts are coupled to each other or in a second decoupling mode in which the second and fourth coupling parts are decoupled from each other.

In an embodiment, a display device includes a display module, a stand, a first coupling unit, and a second coupling unit. The display module is in a curved form. The stand has a curved coupling groove and which the display module is accommodated in or withdrawn from. The first coupling unit is coupled to or decoupled from one end of the stand. The second coupling unit is coupled to or decoupled from the other end of the stand.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
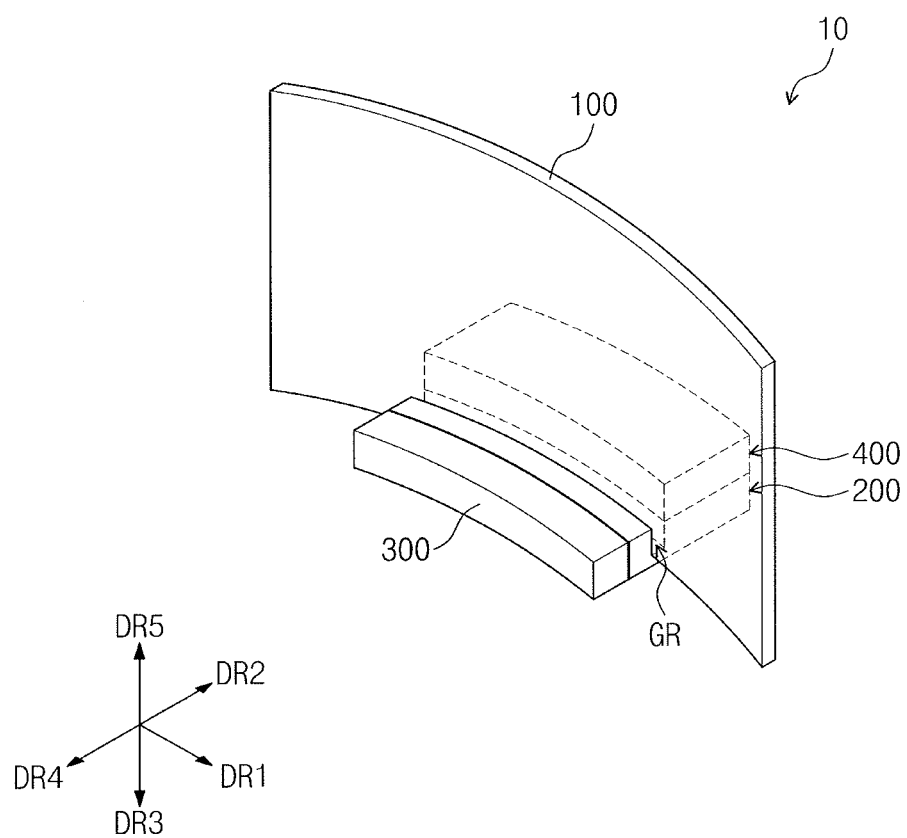
FIG. 1A illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The terms 'first', 'second' may be used to describe various elements, however, the elements should not be limited by these terms. These terms are merely used for the purpose of discriminating one element from another element. For example, the first element may be designated as the second element, and vice versa. A singular form, otherwise indicated, include a plural form.

Herein, the term "comprise" or "have" intends to mean that there may be specified features, numerals, steps, operations, elements, parts, or combinations thereof, not excluding the possibility of the presence or addition of the specified features, numerals, steps, operations, elements, parts, or combinations thereof.

Hereinafter, a display device according to an embodiment will be described.

Figure 1B:
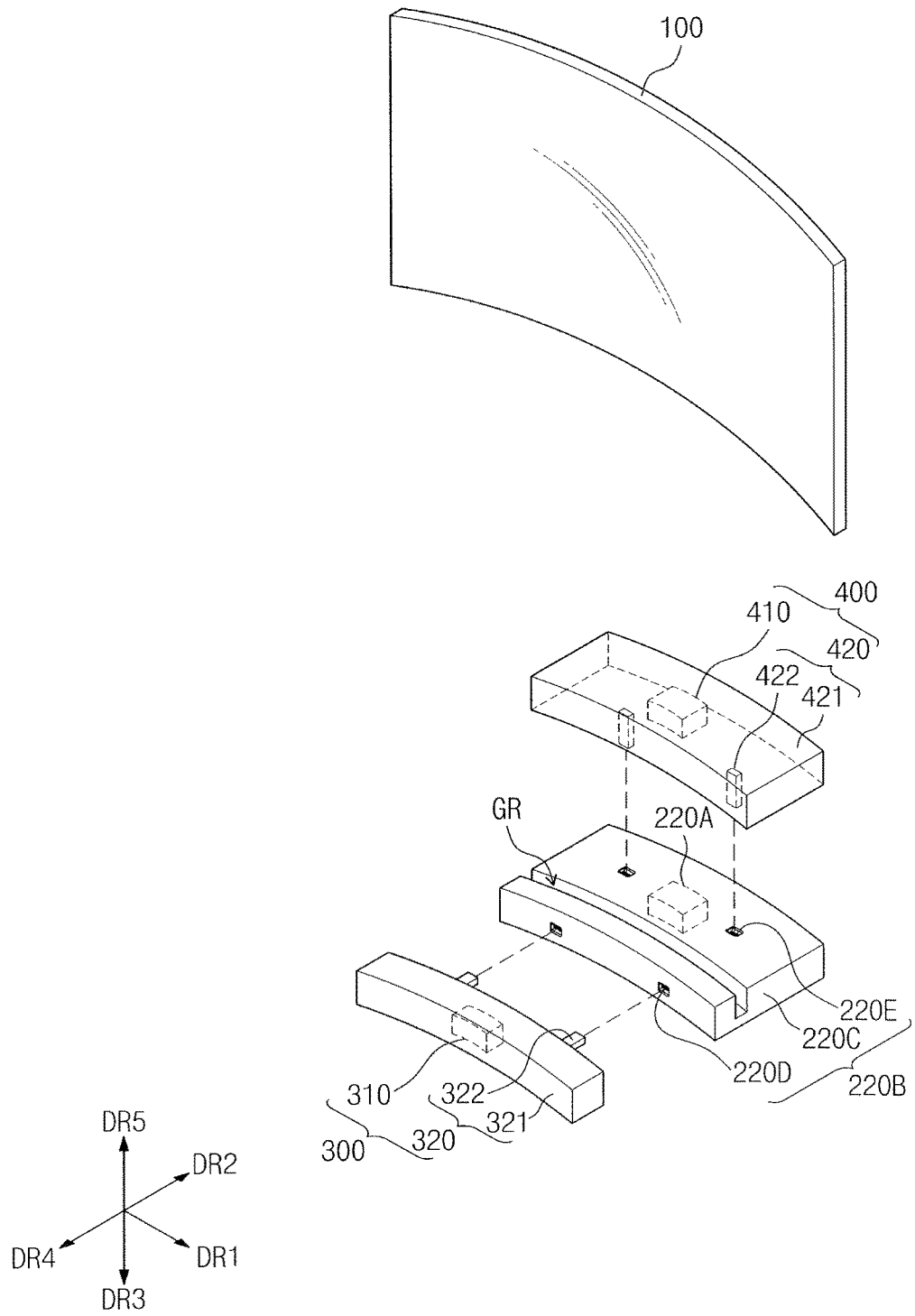
FIG. 1B illustrates an exploded perspective view of a display device according to an embodiment.
Figure 2:
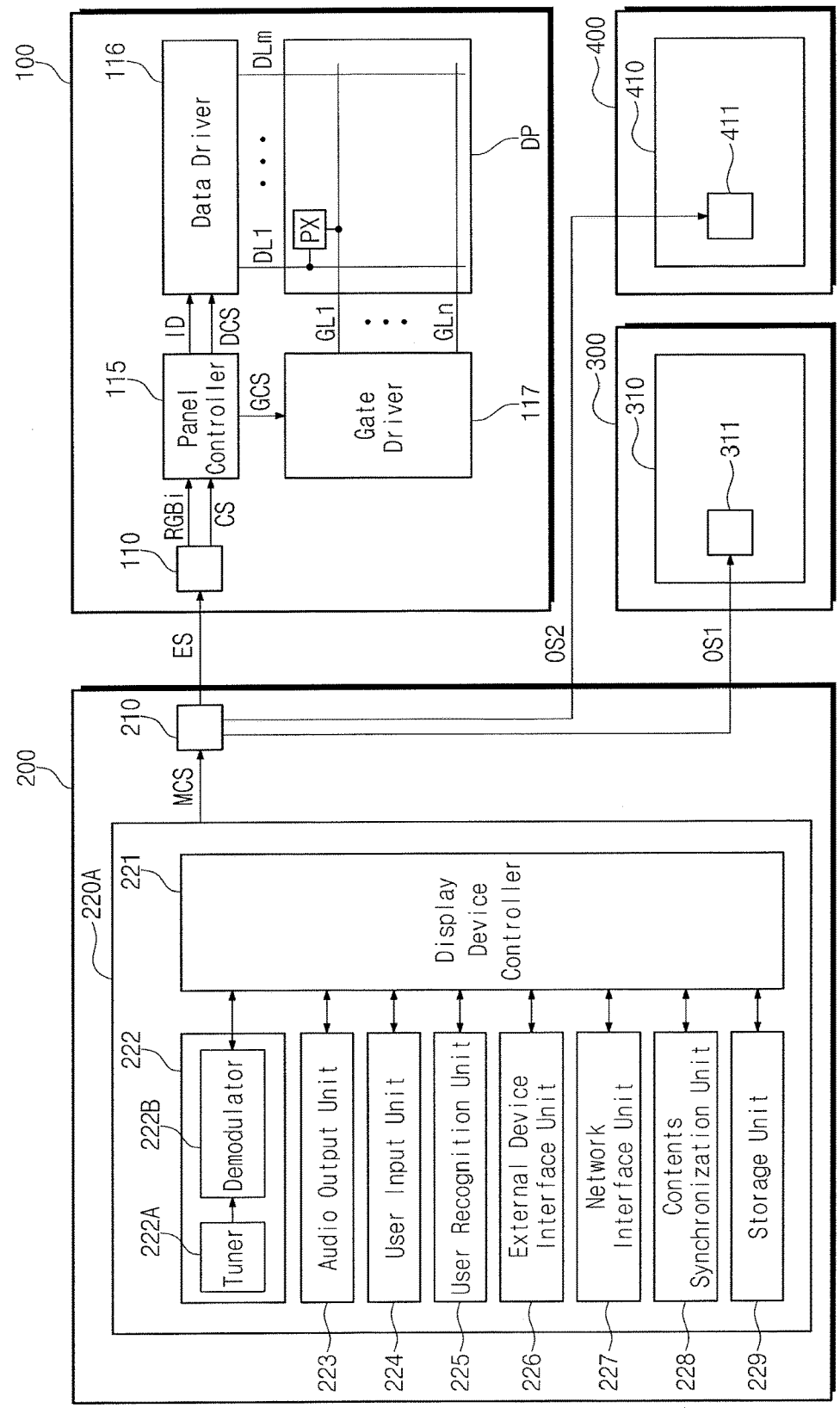
FIG. 2 illustrates a block diagram of a display device according to an embodiment.

FIG. 1A is a perspective view schematically illustrating a display device according to an embodiment. FIG. 1B is an exploded perspective view schematically illustrating a display device according to an embodiment. FIG. 2 is a block diagram schematically illustrating a display device according to an embodiment.

Referring to FIGS. 1A, 1B and 2, a display device 10 according to an embodiment includes a display module 100, a stand 200, a first coupling unit 300, and a second coupling unit 400. The display module 100 receives an image signal ES to display an image.

The display module 100 may be accommodated in or withdrawn from the stand 200. For example, the display module 100 may be accommodated in the stand 200 by receiving an external force in a third direction DR3. For example, the display module 100 may be withdrawn from the stand 200 by receiving the external force in a fifth direction DR5.

The display module 100 may include an image signal receiving unit 110 receiving the image signal ES, as illustrated in FIG. 2. The image signal receiving unit 110 may receive various control signals including a power signal besides the image signal ES. For example, the display module 100 may not display the image when the image signal ES is not provided from the stand 200.

A portion of the display module 100 is accommodated in a coupling groove GR, as illustrated in FIG. 1B, so that the display module 100 stands while a display surface (101 of FIG. 3) thereof faces a user. The display module 100 may have a non-flat shape. The display module 100 may have a curved shape. The display module 100 may have a concave shape when viewed in a direction DR2 from the display surface (101 of FIG. 3) toward a rear surface (102 of FIG. 3), but not limited thereto. In another embodiment, the display module 100 may have a convex shape when viewed in the direction DR2 from the display surface (101 of FIG. 3) toward the rear surface (102 of FIG. 3). The display module 100 may be rigid or flexible. The term 'flexible' may mean "capable of bending or being bent" including all structures ranging from a structure curved by several nano meters to a completely foldable structure.

In the display device 10 according to an embodiment, it is exemplified that the display module 100 has a curved shape, but the embodiment is not limited thereto. In another embodiment, the display module 100 may have a flat plate shape.

The stand 200 has the coupling groove GR in which a portion of the display module 100 is accommodated. The stand 200 may hold the display module 100. The stand 200 includes an electric module 220A and a stand housing 220B.

The stand housing 220B has the coupling groove GR. The coupling groove GR may have a non-flat shape. The coupling groove GR may have a curved shape. In the coupling groove GR, the portion of the display module 100 is accommodated.

Inside the stand housing 220B, a control signal transmitter 210 providing the control signal is provided. The control signal transmitter 210 receives a main control signal MCS from the electric module 220A to provide the image signal ES to the image signal receiving unit 110.

The control signal transmitter 210 may transmit various electric signals including a power signal in addition to the image signal ES to the image signal receiving unit 110. The image signal ES may be provided by wire or wirelessly from the control signal transmitter 210 of the stand 200 to the image signal receiving unit 110 of the display module 100. When the image signal ES is provided wirelessly, for example, the image signal ES may be provided in the Wi-Fi method, the Bluetooth method, or the like.

The control signal transmitter 210 may transmit various electric signals including the power signal in addition to a first driving signal OS1 to a first driving signal receiving unit 311. The first driving signal OS1 may be provided by wire or wirelessly from the control signal transmitter 210 of the stand 200 to the first driving signal receiving unit 311 of the first coupling unit 300. When the first driving signal OS1 is provided wirelessly, for example, the first driving signal OS1 may be provided in the Wi-Fi method, the Bluetooth method, or the like.

The control signal transmitter 210 may transmit various electric signals including the power signal in addition to a second driving signal OS2 to a second driving signal transmitter 411. The second driving signal OS2 may be provided by wire or wirelessly from the control signal transmitter 210 of the stand 200 to the second driving signal receiving unit 411 of the second coupling unit 400. When the second driving signal OS2 is provided wirelessly, for example, the second driving signal OS2 may be provided in the Wi-Fi method, the Bluetooth method, or the like.

The stand housing 220B includes a first stand part 220C, a first coupling part 220D, and a second coupling part 220E. The stand housing 220B will be described in more detail later.

The electric module 220A provides the control signal. The control signal includes the image signal ES, the first driving signal OS1, and the second driving signal OS2. The electric module 220A provides the control signal to the display module 100, to the first coupling unit 300, and to the second coupling unit 400, respectively. More particularly, the electric module 220A provides the image signal ES to the display module 100. The electric module 200A provides the first driving signal OS1 to the first coupling unit 300. The electric module 220A provides the second driving signal OS2 to the second coupling unit 400.

The electric module 220A includes, for example, a display device controller 221, a broadcast receiver 222, an audio output unit 223, a user input unit 224, a user recognition unit 225, an external device interface unit 226, a network interface unit 227, a content synchronization unit 227, and a storage unit 229. In the electric module 220A, at least one of the broadcast receiver 222, the audio output unit 223, the user input unit 224, the user recognition unit 225, the external device interface unit 226, the network interface unit 227, the content synchronization unit 228, and the storage unit 229 may be omitted.

The broadcast receiver 222 may receive a broadcast content and a streaming content which rebroadcasts the broadcast content. The broadcast content may be received from a broadcast station, and the streaming content may be received from a streaming server. The streaming server may be any of various servers providing live broadcasts, recorded broadcast contents, various motion picture contents, etc.

The broadcast receiver 222 may include a tuner 222A and a demodulator 222B. The tuner 222A selects an RF broadcast signal corresponding to a user-selected channel or all of preset channels among radio frequency (RF) broadcast signals received through an antenna. Also, the broadcast receiver 222 converts the selected RF broadcast signal to an intermediate frequency signal or a baseband image or a voice signal. For example, when the selected RF broadcast signal is a digital broadcast signal, the signal is converted to an intermediate frequency IF signal, and when the selected RF broadcast signal is an analog broadcast signal, the signal is converted to a baseband image or a voice signal. The tuner 222A may process the digital broadcast signal or the analog broadcast signal. The tuner 222A may receive a single carrier RF broadcast signal according to the advanced television system committee (ATSC) standard or a multi-carrier RF broadcast signal according to the digital video broadcasting (DVB) standard.

The demodulator 222B receives the digital IF signal converted in the tuner 222A to perform a demodulation. The demodulator 222B may output a stream signal after performing the demodulation and a channel decoding. The stream signal may be a signal in which the image signal, the voice signal or a data signal are multiplexed. The stream signal output from the demodulator 222B may be input into the display device controller 221. At least one of the tuner 222A and the demodulator 222B may also be omitted.

The display device controller 221 provides the image signal ES to the display module 100 after performing a reversed multiplexing, an image signal processing, a voice signal processing.

The audio output unit 223 may output a sound corresponding to an image displayed in the display module 100. The audio output unit 223 may receive a voice processed signal from the display device controller 221 to output the sound. The audio output unit 223 may be provided in the form of a speaker.

The user input unit 224 transmits a control command input by a user to the display device controller 221, or a signal provided from the display device controller 221 to the user.

The user recognition unit 225 may include a camera. The user recognition unit 225 may capture an image of a user by using the camera, and may recognize the user on the basis of the captured image. The information of the captured image may be input into the display device controller 221.

The external device interface unit 226 may transmit or receive data with a connected external device. For this, the external device interface unit 226 may include a wireless communication unit, an A/V input/output unit, a USB accommodation terminal, a high definition multimedia interface (HDMI) connector, an RGB connector, or the like. The external device interface unit 226 may be connected by wire or wireless to an external device such as a digital versatile disk (DVD), a Blu-ray, a game device, a camera, a camcorder, a computer, a laptop, a set-top box, and may also carry out input and output operations with the external device. The A/V input/output unit may receive an image signal or an audio signal of the external device. Meanwhile, the wireless communication unit may perform a near field wireless communication with other electronic devices.

The network interface unit 227 provides an interface to connect the display device 10 according to an embodiment to a wired network including the internet network or a wireless network. For example, the network interface unit 227 may receive contents or data provided by the internet, a contents provider or a network operator through the network.

The contents synchronization unit 228 may perform a control operation such that an image is displayed on the display module 100 according to a synchronization reference time received from a contents synchronization server. The synchronization reference time may be a preset time on the basis of content recognition information. The contents synchronization unit 228 may include a memory storing an image content received.

The storage unit 229 may store a program for processing and controlling various signals in the device control unit 221, or may store a signal processed image, an audio or a data signal. The storage unit 229 may perform a function of temporarily storing an image, an audio or a data signal input into the interface unit 226. The storage unit 229 may store information associated with a predetermined broadcast channel through a channel memory function such as a channel map.

In general, it may be difficult to make a display module slim because the display module includes at least one from among the display device controller, the broadcast receiver, the audio output unit, the user input unit, the user recognition unit, the external device interface unit, the network interface unit, the contents synchronization unit, and the storage unit which are included in the electric module. In contrast, the display device 10 according to an embodiment may realize the display module 100 with a slim structure by including the electric module 220A for driving the display module 100 in the stand 200, rather than in the display module 100 itself.

The display module 100 includes an image signal receiving unit 110, a display panel DP, a panel controller 115, a data driver 116, and a gate driver 117. The image signal receiving unit 110 receives the image signal ES from the control signal transmitting unit 210. The display panel DP displays an image.

The panel controller 115 controls operations of the data driver 116 and the gate driver 117, and receives an input image signal RGBi and multiple control signals CS. The panel controller 115 generates output image data ID by converting data format of the input image signal RGBi to be matched with the interface specification of the data driver 116 and structure of the display panel DP, and provide the output image data ID to the data driver 116.

The panel controller 115 generates a gate control signal GCS (for example, a vertical start signal, a vertical clerk signal, and a vertical clerk bar signal) and a data control signal DCS (for example, an output start signal and a horizontal start signal). The gate control signal GCS is provided to the gate driver 117, and the data control signal DCS is provided to the data driver 116.

The data driver 116 converts the output image data ID to a data voltage in response to the data control signal DCS provided from the panel controller 115 and output the same. The output data voltages are applied to the display panel DP.

The gate driver 117 sequentially outputs gate signals in response to the gate control signal GCS provided from the panel controller 115.

The display panel DP includes a plurality of gate lines GL1 to GLn, a plurality of data lines DL1 to DLm, and a plurality of pixels PX. In FIG. 2, first and $n^{th}$ gate lines GL1 and GLn of the plurality of gate lines GL1 to GLn are only exemplarily illustrated, and an illustration for remaining gate lines is omitted. Also, in FIG. 2, first and $m^{th}$ data lines of the plurality of data lines DL1 to DLm are only illustrated, and an illustration for remaining data lines is omitted.

The plurality of gate lines GL1 to GLn are connected to the gate driver 117 to receive the gate signals from the gate driver 117. The plurality of data lines DL1 to DLm are connected to the data driver 116 to receive data voltages from the data driver 116.

The pixels PX are arranged in a matrix form. The pixels PX may display at least any one of primary colors such as red, green, and blue. The colors which the pixels PX may display are not limited to the red, green, and blue, but the pixels PX may display various colors including secondary primary colors such as yellow, cyan, and magenta in addition to the red, green, and blue colors.

The pixels PX may be defined as a configuration to display a unit image, and resolution of the display panel DP may be determined by the number of pixels PX provided in the display panel DP. In FIG. 2, only one pixel PX is illustrated, and an illustration for the remaining pixels is omitted.

The pixels PX may be driven by a connection to a corresponding gate line among the plurality of gate lines GL1 to GLn and a corresponding data line among the plurality of data lines DL1 to DLm.

Figure 3:
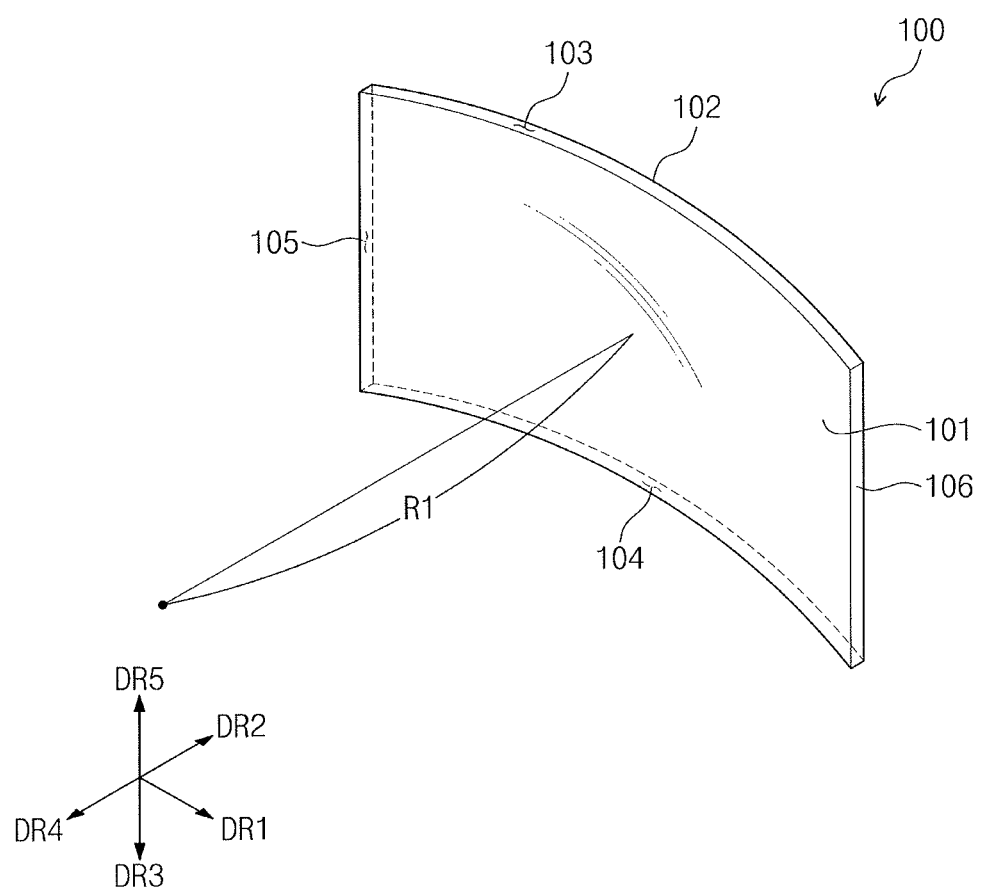
FIG. 3 illustrates a perspective view of a display module included in a display device according to an embodiment.
Figure 4A:
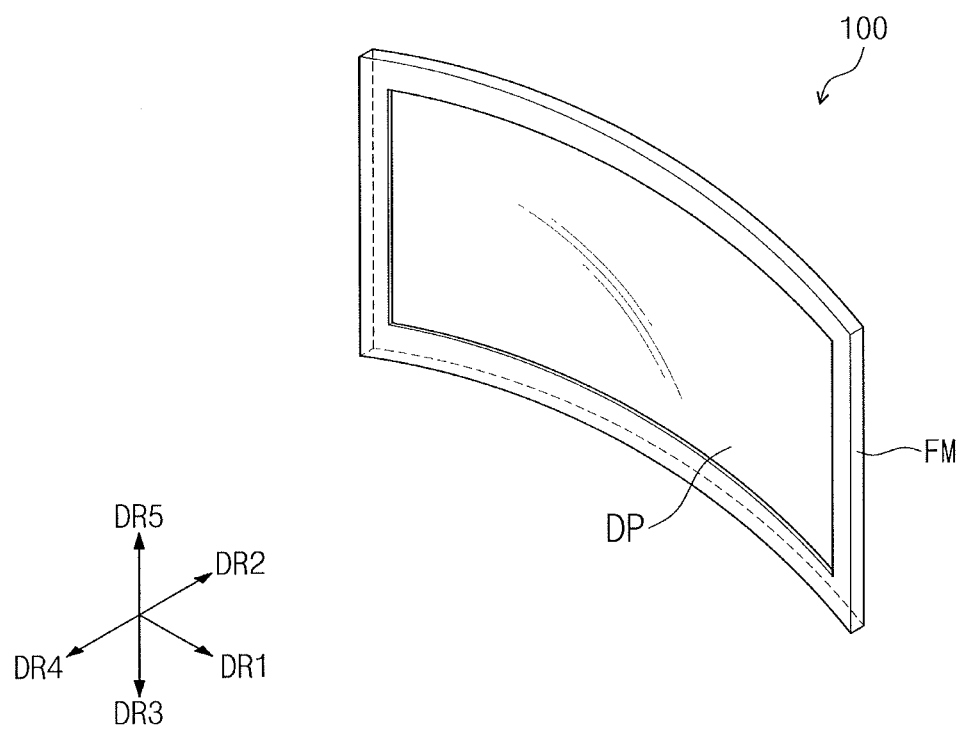
FIG. 4A illustrates a perspective view of a display module included in a display device according to an embodiment.
Figure 4B:
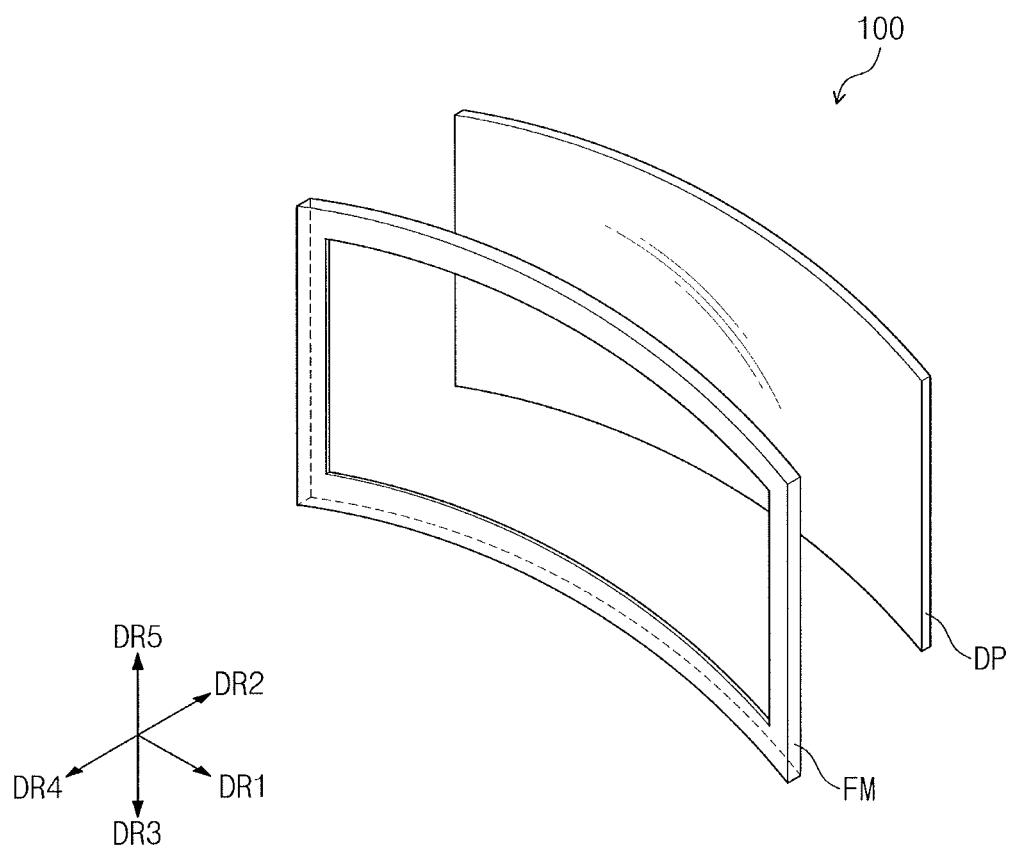
FIG. 4B illustrates an exploded perspective view of a display module included in a display device according to an embodiment.

FIG. 3 is a perspective view schematically illustrating the display module 100 included in the display device 10 according to an embodiment. FIG. 4A is a perspective view schematically illustrating a display module included in a display device according to an embodiment. FIG. 4B is an exploded perspective view schematically illustrating a display module included in a display device according to an embodiment.

Referring to FIGS. 1A, 1B, 2, 3, 4A and 4B, the display module 100 may have a curved shape. The display module 100 may have a first radius of curvature R1. The first radius of curvature R1 may range from 2000 mm to 5000 mm. When the first radius of curvature R1 is less than 2000 mm, a user may not effectively recognize a displayed image, and when the first radius of curvature R1 is greater than 5000 mm, a three-dimensional effect, immersion, and presence of a user with respect to the image displayed by the display device 10 may be reduced.

For the convenience of explanation, the display module 100 is illustrated to have a curved rectangular parallelepiped shape, however, the actual display module 100 may have a stepped portion on at least one surface among the display surface 101, the rear surface 102, an upper surface 103, a lower surface 104, a first side surface 105, and a second side surface 106.

As illustrated in FIG. 3, the display module 100 may have the display surface 101, the rear surface 102, the upper surface 103, the lower surface 104, the first side surface 105, and the second side surface 106. The display surface 101 may be defined by a first surface of the display panel DP and a first surface of a frame FM surrounding the first surface of the display panel DP (FIG. 4A). The rear surface 102 may be defined by a second surface of the display panel DP and a second surface of the frame FM surrounding the second surface of the display panel DP. Each of the upper surface 103, the lower surface 104, the first side surface 105, and the second side surface 106 may be, for example, a side surface connecting the first surface of the frame FM to the second surface of the frame FM.

The display surface 101 emits an image from at least a portion thereof. The display surface 101 may have a curved shape. The display surface 101 may have a concave shape when viewed in the direction DR2 from the display surface 101 toward the rear surface 102, but not limited thereto. The display surface 101 may have a convex shape when viewed in the direction DR2 from the display surface 101 toward the rear surface 102. The display surface 101 may have, for example, a first radius of curvature R1. A portion of the display surface 101 is accommodated in the coupling groove GR.

The rear surface 102 is opposed to the display surface 101. A portion of the rear surface 102 is accommodated in the coupling groove GR. The rear surface 102 may have a curved shape. The rear surface 102 may have a concave shape when viewed in the direction DR2 from the display surface 101 toward the rear surface 102, but not limited thereto. The rear surface 102 may also have a convex shape when viewed in the direction DR2 from the display surface 101 toward the rear surface 102. A radius of curvature-maintaining member may be provided so as to maintain the radius of curvature of the remaining portion of the rear surface 102 which is not accommodated in the coupling groove GR.

In FIGS. 1A and 3, it is exemplarily illustrated that the radius of the curvature of the display surface 101 is less than the radius of curvature of the rear surface 102, but the embodiment is not limited thereto. The radius of curvature of the display surface 101 may be greater than the radius of curvature of the rear surface 102. In FIGS. 1A and 3, it is exemplarily illustrated that the shape of the display surface 101 is the same as the shape of the rear surface 102, and the size of the shape of display surface 101 is the same as the size of the shape of the rear surface 102, but the embodiment is not limited thereto. The shape of the display surface 101 and the shape of the rear surface 102 may also be different from each other, and the size of the shape of the display surface 101 and the size of the shape of the rear surface 102 may also be different from each other.

The upper surface 103 and the lower surface 104 are opposed to each other. The upper surface 103 is connected to the display surface 101 and the rear surface 102. The upper surface 103 may have a curved shape. For example, the upper surface 103 may have a curved shape when viewed in the plane. In FIGS. 1A and 3, it is exemplarily illustrated that the shape of the upper surface 103 is the same as the shape of the lower surface 104, and the size of the shape of the upper surface 103 is the same as the size of the shape of the lower surface 104, but the embodiment is not limited thereto. The shape of the upper surface 103 and the shape of the lower surface 104 may also be different from each other, and the size of the shape of the upper surface 103 and the size of the shape of the lower surface 104 may also be different from each other.

The lower surface 104 is connected to the display surface 101 and the rear surface 102. The lower surface 104 may have a curved shape. For example, the lower surface 104 may have a curved shape when viewed in the plane. At least a portion of the lower surface 104 may be in contact with the coupling groove GR.

The first side surface 105 is connected to the upper surface 103 and the lower surface 104. In FIGS. 1A and 3, it is illustrated that the first side surface 105 has a rectangular shape, but the embodiment is not limited thereto. The first side surface 105 may have various shapes such as a trapezoidal shape or a curved rectangular shape.

The second side surface 106 opposed to the first side surface 105. The second side surface 106 is connected to the upper surface 103 and the lower surface 104. In FIGS. 1A and 3, it is exemplarily illustrated that the second side surface 106 has a rectangular shape, but the embodiment is not limited thereto. The second side surface 106 may have various shapes such as the trapezoidal shape or the curved rectangular shape. Also, in FIGS. 1A and 3, it is exemplarily illustrated that the shape of the first side surface 105 and the shape of the second side surface 106 are same to each other, and the size of the shape of the first side surface 105 and the size of the shape of the second side surface 106 are same to each other, but the embodiment is not limited thereto. The shape of the first side surface 105 and the shape of the second side surface 106 may also be different from each other, and the size of the shape of the first side surface 105 and the size of the shape of the second side surface 106 may also be different from each other.

As aforementioned, when the display module 100 receives the image signal ES, an image is displayed on the display surface 101. When the display module 100 receives the image signal ES, the image may also be displayed on at least one of the rear surface 102, the upper surface 103, the first side surface 105, and the second side surface 106.

Referring to FIGS. 1A, 1B, 3, 4A and 4B, the display module 100 may include the display panel DP and the frame FM.

The display panel DP may have a curved shape. The display panel DP may have a concave shape when viewed in the direction DR2 from the display surface 101 toward the rear surface 102, but the embodiment is not limited thereto. The display panel DP may also have a convex shape when viewed in the direction DR2 from the display surface 101 to the rear surface 102.

The display panel DP may be an organic light emitting display panel, a liquid crystal display panel, a plasma display panel, an electrophoretic display panel, a microelectromechanical system (MEMS) display panel, an electrowetting display panel, or the like.

The display panel DP may also be rigid or flexible. In the display device 10 according to an embodiment, it is exemplarily illustrated that the display panel DP is a curved type, but the embodiment is not limited thereto. In another embodiment, the display panel DP may also be a planar plate type.

The frame FM surrounds at least a portion of an edge of the display panel DP. The frame FM may maintain the shape of the display panel DP. The frame FM may include at least one of a bottom chassis, a mold frame, and a top chassis. At least a portion of the frame FM is accommodated in the coupling groove GR.

Figure 5A:
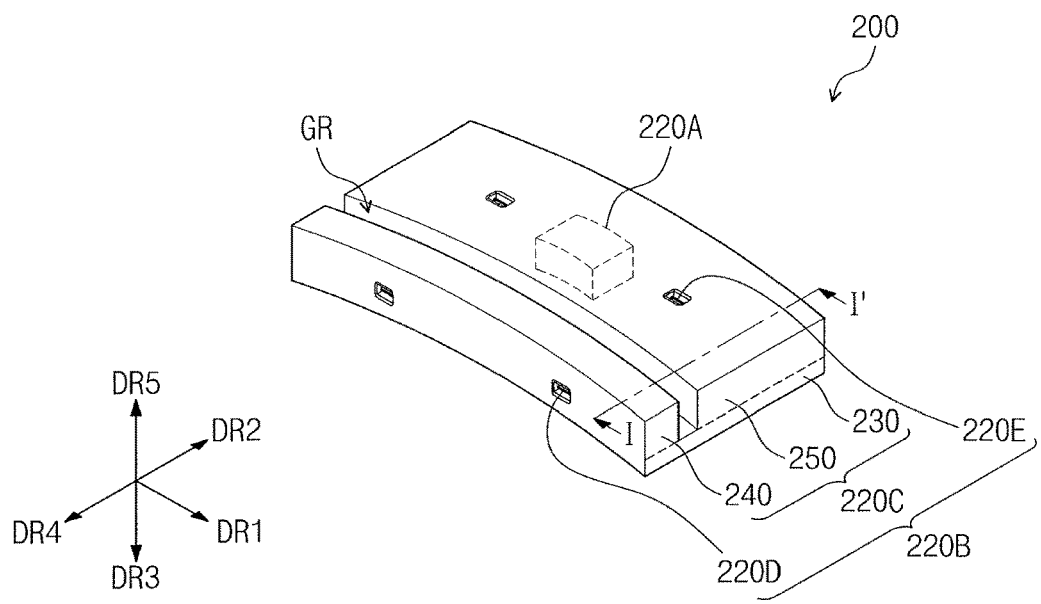
FIG. 5A illustrates a perspective view of a stand included in a display device according to an embodiment.
Figure 5B:
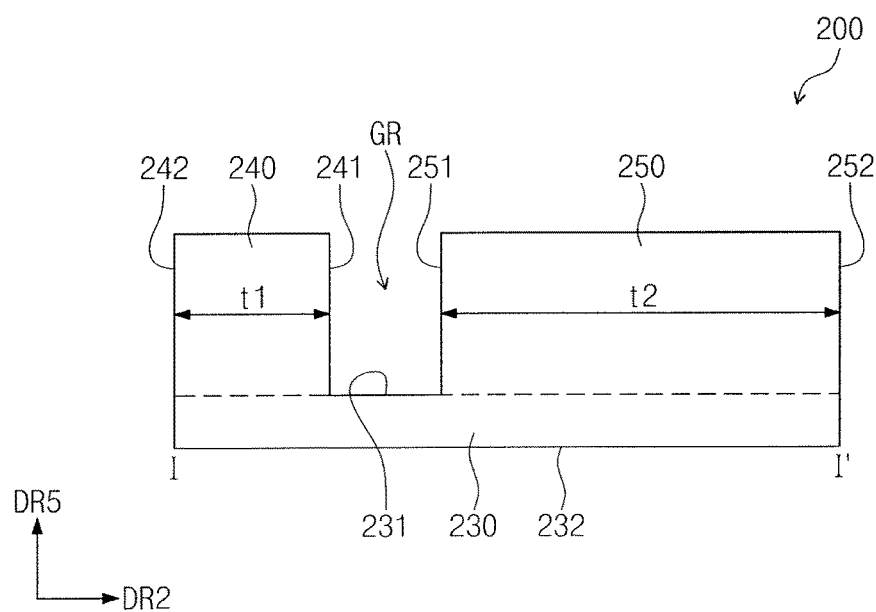
FIG. 5B illustrates a schematic cross-sectional view corresponding to line I-I' of FIG. 5A.
Figure 5C:
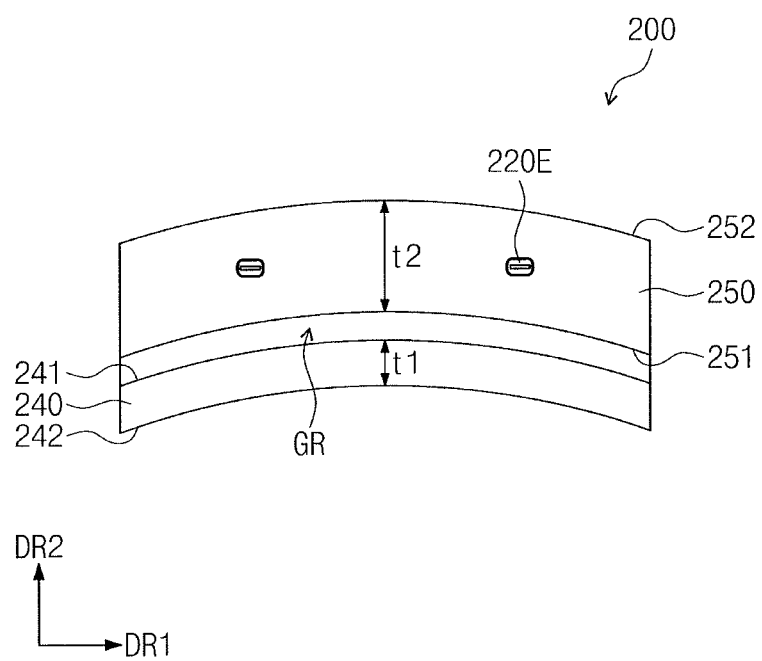
FIG. 5C illustrates a cross-sectional view of a stand included in a display device according to an embodiment.

FIG. 5A is a perspective view schematically illustrating the stand 200 included in the display device 10 according to an embodiment. FIG. 5B is a schematic cross-sectional view along line I-I' of FIG. 5A. FIG. 5C is a top cross-sectional view schematically illustrating the stand 200.

Referring to FIGS. 1A, 1B, 2, 3, and 5A to 5C, as aforementioned, the stand 200 has the coupling groove GR in which the display module 100 is accommodated, and provides the image signal ES. The stand 200 further includes the control signal transmitter 210, the electric module 220A, and the stand housing 220B.

The control signal transmitter 210 may receive a main control signal MCS from the electric module 220A and provide the image signal ES to the image signal receiving unit 110. The electric module 220A provides the main control signal MCS for displaying an image on the display module 100 to the control signal transmitter 210.

In FIG. 5A, it is illustrated that the electric module 220A has a curved thick rectangular shape for the convenience of explanation, but the electric module 220A may be provided in a curved thin chip shape. Also, when the electric module 220A is received inside the stand housing 220B, the electric module 220A may be randomly disposed inside the stand housing 220B. In FIG. 5A, it is illustrated that the electric module 220A is one member for the convenience of explanation, but the embodiment is not limited thereto. In another embodiment, the electric module 220A may be configured as a plurality of members.

The stand housing 220B may receive the electric module 220A therein. The stand housing 220B includes a stand part 220C, a first coupling part 220D, and a second coupling part 220E. The first coupling part 220D and the second coupling part 220E will be later described in more detail.

The stand part 220C includes a first sidewall part 240 and a second sidewall part 250. The coupling groove GR may be defined by an upper surface 231 of the bottom part 230, an inner surface 241 of the first sidewall part 240, and an inner surface 251 of the second sidewall part 250. A lower surface 232 of the bottom part 230 is connected to an outer surface 242 of the first sidewall part 240 and an outer surface 252 of the second sidewall part 250.

The upper surface 231 of the bottom part 230 is exposed to the outside. The upper surface 231 of the bottom part 230 overlaps the display module 100 when viewed in the plane. The first sidewall part 240 is connected to the bottom part 230. A portion of the inner surface 241 of the first sidewall part 240 contacts the bottom part 230, and a remaining portion of the inner surface 241 of the first sidewall part 240 is exposed to the outside. The first sidewall part 240 overlaps a portion of the display module 100 when viewed in the direction DR2 from the display surface 101 toward the rear surface 102. The first sidewall part 240 overlaps a portion of the display surface 101 and a portion of the rear surface 102 when viewed in the direction DR2 from the display surface 101 toward the rear surface 102.

The first sidewall part 240 may have a non-flat shape. The inner surface 241 of the first sidewall part 240 may be a non-flat surface. The inner surface 241 of the first sidewall surface 240 may be a curved surface. The outer surface 242 of the first sidewall part 240 may be a non-flat surface. The outer surface 242 of the first sidewall part 240 may be a curved surface, but be not limited thereto. The inner surface 241 of the first sidewall part 240 may be a curved surface while the outer surface 242 of the first sidewall part 240 may be a flat surface.

Distance t1 between the inner and outer surfaces 241 and 242 of the first sidewall part 240 may be constant, but the embodiment is not limited thereto. The distance t1 between the inner and outer surfaces 241 and 242 of the first sidewall part 240 may not be constant.

The second sidewall part 250 is spaced apart from the first sidewall part 240. The second sidewall part 250 is connected to the bottom part 230. A portion of the inner surface 251 of the second sidewall part 250 contacts the bottom part 230, and a remaining portion of the inner surface 251 of the second sidewall part 250 is exposed to the outside. The second sidewall part 250 overlaps a portion of the display module when viewed in the direction DR2 from the display surface 101 to the rear surface 102.

The second sidewall part 250 may have a non-flat shape. The inner surface 251 of the second sidewall part 250 may be a non-flat surface. The inner surface 251 of the second sidewall surface 250 may be a curved surface. The outer surface 252 of the second sidewall surface 250 may be a non-flat surface. The outer surface 252 of the second sidewall part 250 may be a curved surface, but not limited thereto. The inner surface 251 of the second sidewall surface 250 may be a non-flat surface while the outer surface 252 of the second sidewall part 250 may also be a flat surface. The inner surface 251 of the second sidewall part 250 may be a curved surface while the outer surface 252 of the second sidewall part 250 may also be a flat surface.

Distance t2 between the inner and outer surfaces 251 and 252 of the second sidewall surface 250 may be constant, but not limited thereto. The distance t2 between the inner and outer surfaces 251 and 252 of the first sidewall part 250 may not be constant. For example, the distance t2 between the inner and outer surfaces 251 and 252 when viewed in the plane may gradually decrease as it travels from the center of the second sidewall part 250 towards one end thereof.

The distance t1 between the inner and outer surfaces 241 and 242 of the first sidewall part 240 when viewed in the direction DR2 from the display surface 101 toward the rear surface 102 may be different from the distance t2 between the inner and outer surfaces 251 and 252 of the second sidewall part 250 when viewed in the direction DR2 from the display surface 101 toward the rear surface 102, but the embodiment is not limited thereto. In another embodiment, the distance t1 between the inner and outer surfaces 241 and 242 of the first sidewall part 240 when viewed in the direction DR2 from the display surface 101 toward the rear surface 102 may be the same as the distance t2 between the inner and outer surfaces 251 and 252 of the second sidewall part 250 when viewed in the direction DR2 from the display surface 101 to the rear surface 102.

The distance t1 between the inner and outer surfaces 241 and 242 of the first sidewall part 240 when viewed in the direction DR2 from the display surface 101 toward the rear surface 102 may be less than the distance t2 between the inner and outer surfaces 251 and 252 of the second sidewall part 250 when viewed in the direction DR2 from the display surface 101 toward the rear surface 102 (FIG. 5B), but the embodiment is not limited thereto. In another embodiment, The distance t1 between the inner and outer surfaces 241 and 242 of the first sidewall part 240 when viewed in the direction DR2 from the display surface 101 to the rear surface 102 may be greater than the distance t2 between the inner and outer surfaces 251 and 252 of the second sidewall part 250 when viewed in the direction DR2 from the display surface 101 to the rear surface 102.

Figure 6A:
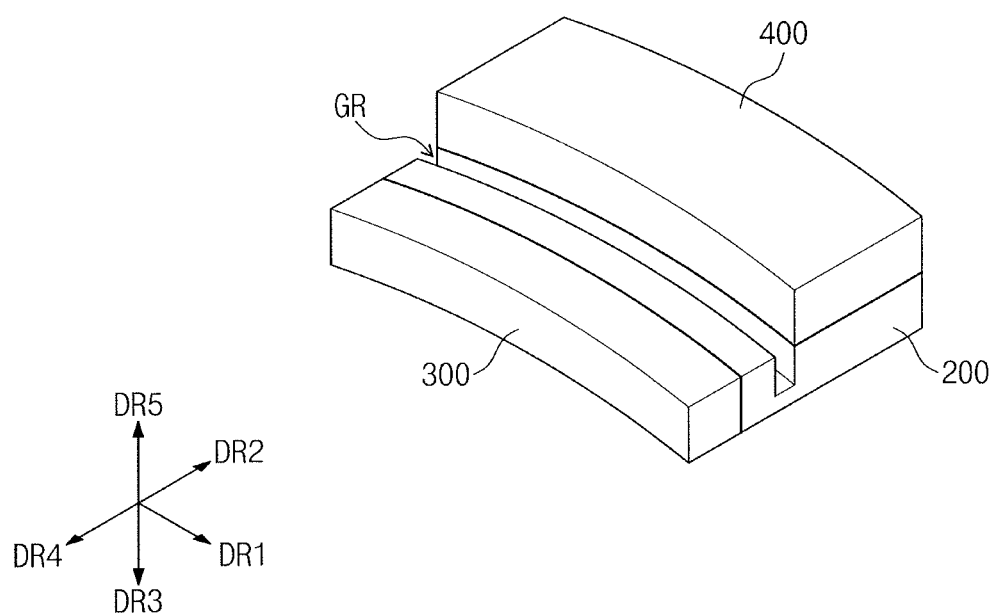
FIG. 6A illustrates a perspective view of a display device according to an embodiment in which a first coupling unit and a second coupling unit that are coupled to each other.
Figure 6B:
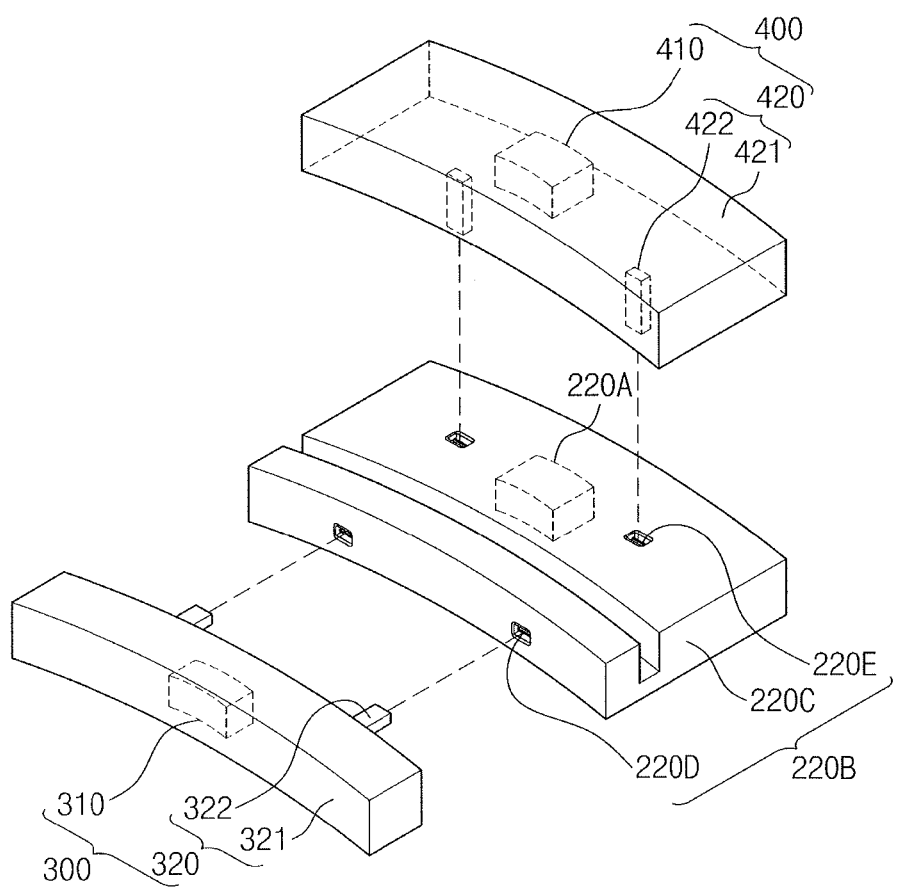
FIG. 6B illustrates a perspective view of a display device according to an embodiment in which a first coupling unit and a second coupling unit are decoupled from each other.
Figure 6B:
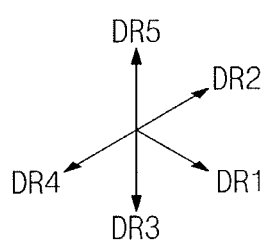

FIG. 6A is a perspective view schematically illustrating the display device 10 according to an embodiment in which the first coupling unit 300 and the second coupling unit 400 are coupled to each other. FIG. 6B is a perspective view schematically illustrating the display device 10 according to an embodiment in which the first coupling unit 300 and the second coupling unit 400 are decoupled from each other.

Referring to FIGS. 1A, 1B, 6A, and 6B, the first coupling unit 300 may be coupled to or decoupled from the stand 200. The display device 10 according to an embodiment may operate in a first coupling mode or in a first decoupling mode. In the first coupling mode, the first coupling unit 300 is coupled to the stand 200. In the first decoupling mode, the first coupling unit 300 is decoupled from the stand 200.

The second coupling unit 400 may be coupled to or decoupled from the stand 200. The display device 10 according to an embodiment may operate in a second coupling mode or in a second decoupling mode. In the second coupling mode, the second coupling unit 400 is coupled to the stand 200. In the second decoupling mode, the second coupling unit 400 is decoupled from the stand 200. The first coupling unit 300 and the second coupling unit 400 will be later described in more detail.

Figure 7A:
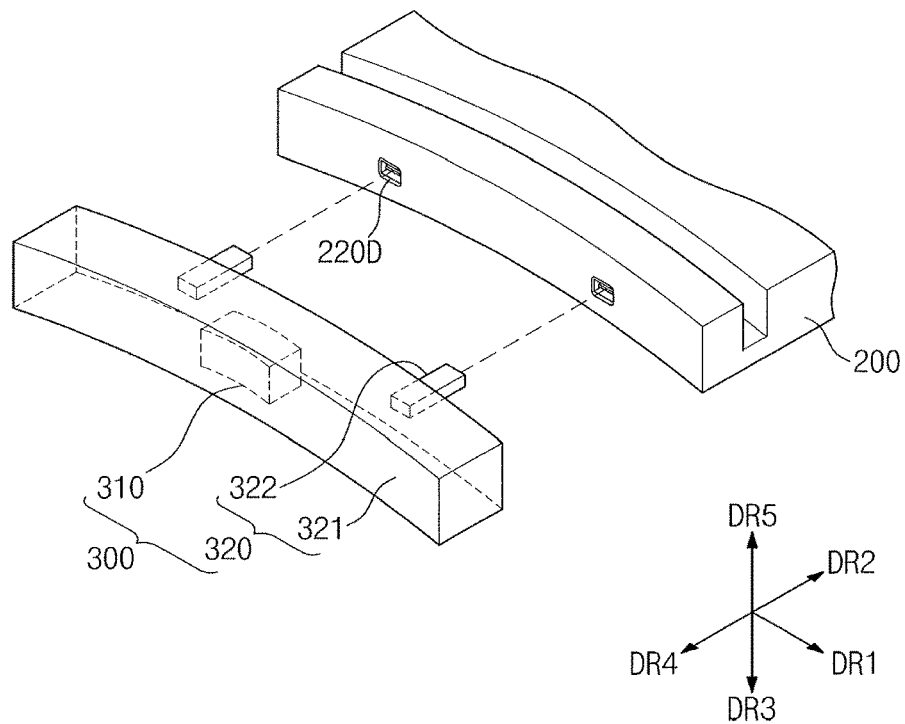
FIG. 7A illustrates a perspective view of a display device according to an embodiment in which a stand and a first coupling unit are decoupled from each other.
Figure 7B:
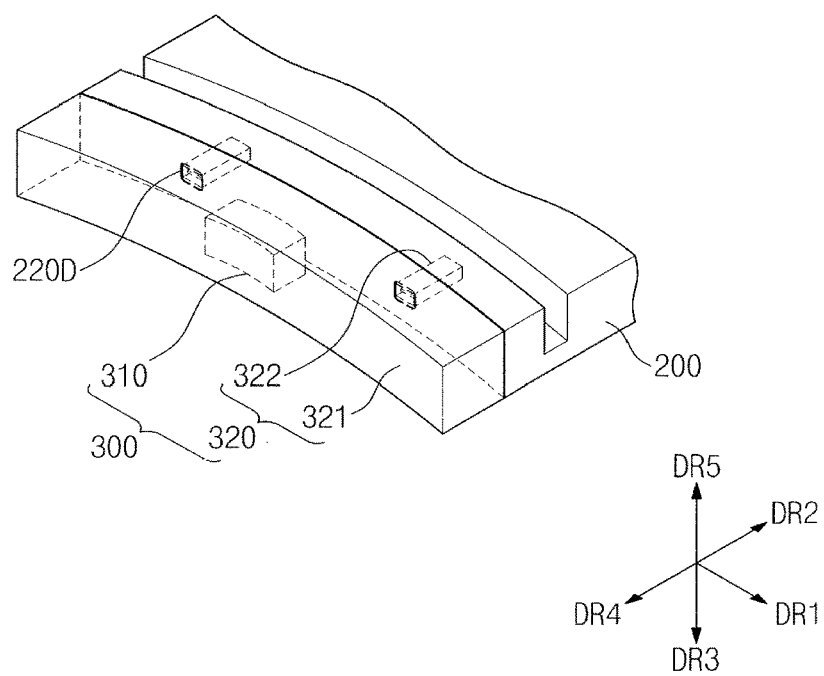
FIG. 7B illustrates a perspective view of a display device according to an embodiment in which a stand and a first coupling unit are coupled to each other.

FIG. 7A is a perspective view schematically illustrating the display device 10 according to an embodiment in which the stand 200 and the first coupling unit 300 are decoupled from each other. FIG. 7B is a perspective view schematically illustrating the display device 10 according to an embodiment in which the stand 200 and the first coupling unit 300 are coupled to each other.

Referring to FIGS. 1A, 1B, 2, 7A, and 7B, the first coupling unit 300 may be coupled to or decoupled from the stand 200. For example, the first coupling unit 300 may receive an external force in the second direction DR2 to be coupled to the stand 200.

The display device 10 according to an embodiment may operate in the first coupling mode and the first decoupling mode. In the first coupling mode, the first coupling unit 300 is coupled to the stand 200. In the first decoupling mode, the first coupling unit 300 is decoupled from the stand 200.

As aforementioned, the stand housing 220B includes the stand part 220C, the first coupling part 220D, and the second coupling part 220E. The first coupling part 220D may be recessed from one end of the stand part 220C, but the embodiment is not limited thereto. In another embodiment, the first coupling part 220D may be protruded from one end of the stand part 220C and the second coupling part 220E may be recessed from one end of the stand part 220C, but the embodiment is not limited thereto. In another embodiment, the second coupling part 220E may be protruded from one end of the stand part 220C.

The first coupling unit 300 includes the first operating signal receiving unit 311, a first module 310, and a first coupling housing 320. The first operating signal receiving unit 311 may receive the first operating signal OS1 transmitted from the control signal transmitter 210. The first operating signal receiving unit 311 may be, for example, provided inside the first coupling housing 320. The first operating signal receiving unit 311 may be, for example, randomly disposed inside the first coupling housing 320. The first operating signal receiving unit 311 may be included inside the first module 310, but the embodiment is not limited thereto. The first operating signal receiving unit 311 may be provided spaced apart from the first module 310.

The first module 310 may be, e.g., a speaker, a tuner, a computer, and a charger for electronic devices. Herein, the computer may be, for example, an all-in-one computer or the like. The electronic devices may be, for example, a mobile phone, a tablet, etc. When the first module 310 is the speaker, the audio output unit 223 of the stand 200 may also be omitted. When the first module 310 is the tuner, the tuner 222A of the stand 200 may also be omitted.

The first module 310 may receive a control signal from the stand 200. The first module 310 may receive the control signal from the electric module 220A. The first module 310 may receive the control signal by wire or wirelessly.

In FIGS. 7A and 7B, although it is illustrated that the first module 310 has a curved thick rectangular shape for the convenience of explanation, the first module 310 may be provided in a curved thin chip shape. Also, as long as the first module 310 contacts at least a portion of the first coupling housing 320, the first module 310 may be randomly disposed. For example, the first module 310 may also be accommodated inside the first coupling housing 320 and may also be provided on the first coupling housing 320. In FIGS. 7A and 7B, it is illustrated that the first module 310 is one member, but the embodiment is not limited thereto. In another embodiment, the first module 310 may be configured with a plurality of members.

The first coupling housing 320 is coupled to the stand housing 220B. The first coupling housing 320 includes a first support part 321 and a third coupling part 322. The first support part 321 may contact at least a portion of the first module 310. The first support part 321 may have a curved shape. In FIGS. 7A and 7B, it is exemplarily illustrated that the first support part 321 has a curved rectangular parallelepiped shape, but the embodiment is not limited thereto. In another embodiment, the first support part 321 may have various shapes, e.g., a curved cube, a curved cylinder, a curved cylindroids, etc.

The third coupling part 322 may be protruded from one end of the first support part 321, but the embodiment is not limited thereto. In another embodiment, the third coupling part 322 may be recessed from one end of the first support part 321. Herein, the first coupling part 220D may be protruded from one end of the stand part 220C.

The third coupling part 322 may be, e.g., a USB connector, a pogo block, and a jig block. However, the third coupling part 322 is not particularly limited as long as the third coupling part 322 is coupled to or decoupled from the first coupling part 220D. When the first coupling part 220D is a USB connector, the third coupling part 322 may be a corresponding USB connector. For example, when the first coupling part 220D is a USB connection port, the third coupling part 322 may be a USB socket port to accommodate the USB connection port. When the first coupling part 220D is a jig block, the third coupling part 322 may be a corresponding jig block.

The third coupling part 322 may be provided in plurality. In FIGS. 7A and 7B, it is exemplarily illustrated that the third coupling part 322 includes two parts, but the embodiment is not limited thereto. In another embodiment, the third coupling part 322 may include a plurality of, for example, three or more parts. Also, the third coupling part 322 may be one part.

Figure 8A:
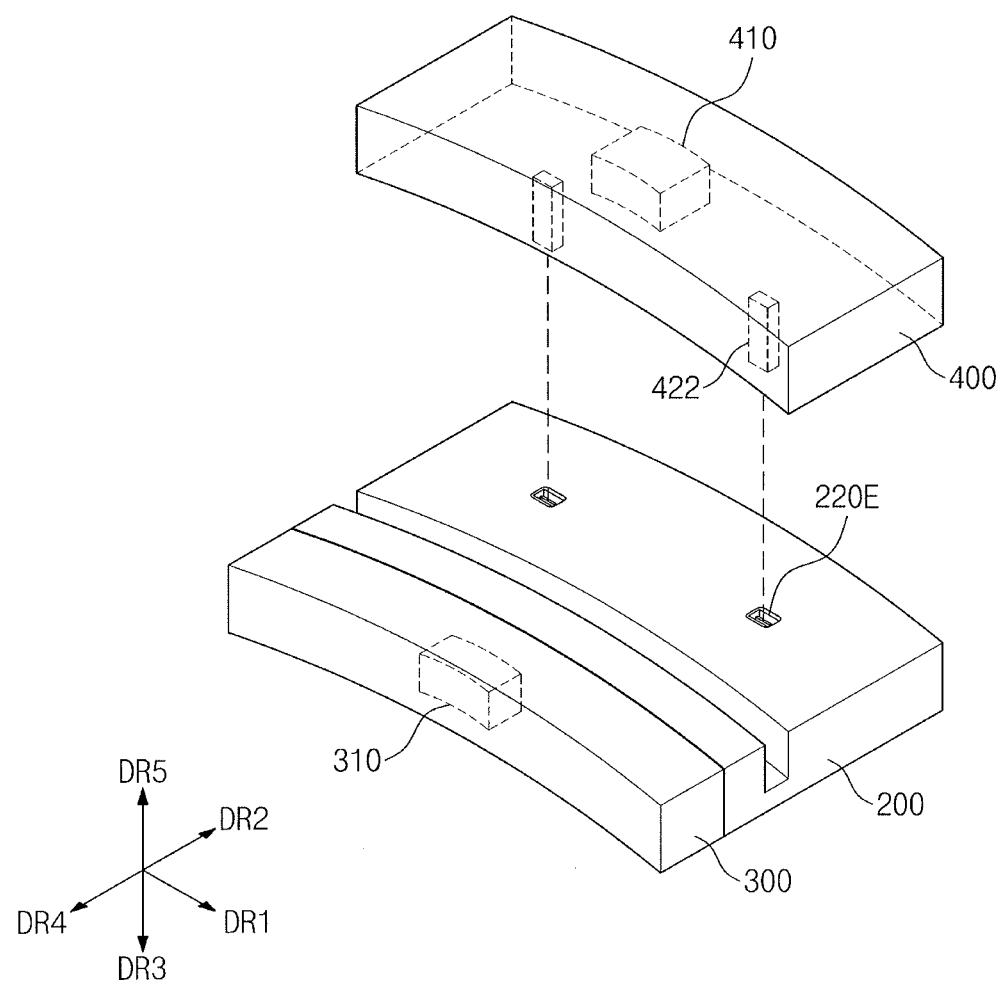
FIG. 8A illustrates a perspective view of a display device according to an embodiment in which a stand and a second coupling unit are decoupled from each other.
Figure 8B:
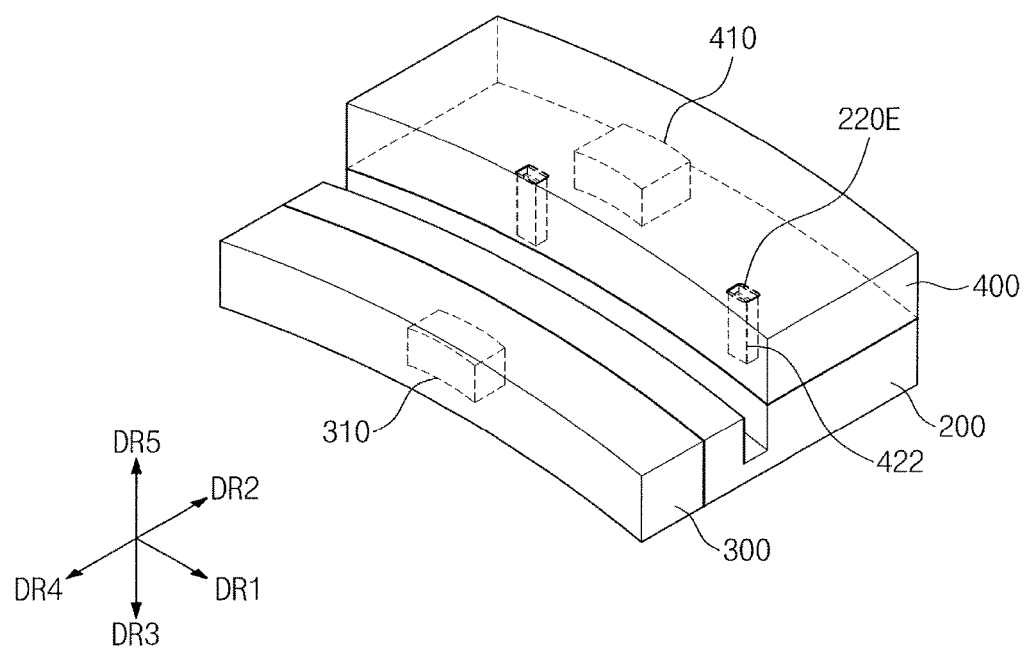
FIG. 8B illustrates a perspective view of a display device according to an embodiment in which a stand and a second coupling unit are coupled to each other.

FIG. 8A is a perspective view schematically illustrating the display device 10 according to an embodiment in which the stand 200 and the second coupling unit 400 are decoupled from each other. FIG. 8B is a perspective view schematically illustrating the display device 10 according to an embodiment in which the stand 200 and the second coupling unit 400 are coupled to each other.

Referring to FIGS. 1A, 1B, 2, 6A, 8A, and 8B, the second coupling unit 400 may be coupled to or decoupled from the stand 200. For example, the second coupling unit 400 may receive an external force in the third direction DR3 to be coupled to the stand 200. For example, the second coupling unit 400 receives the external force in a fifth direction DR5 to be decoupled from the stand 200.

The display device 10 according to an embodiment may operate in a second coupling mode and a second decoupling mode. In the second coupling mode, the second coupling unit 400 is coupled to the stand 200. In the second decoupling mode, the second coupling unit is decoupled from the stand 200.

As aforementioned, the stand housing 220B includes the stand part 220C, the first coupling part 220D, and the second coupling part 220E, but the embodiment is not limited thereto. The first coupling part 220D may be recessed from one end of the stand part 220C, but the embodiment is not limited thereto. In another embodiment, the first coupling part 220D may be protruded from one end of the stand part 220C. The second coupling part 220E may be recessed from one end of the stand part 220C, but the embodiment is not limited thereto. In another embodiment, the second coupling part 220E may be protruded from one end of the stand part 220C.

The second coupling unit 400 includes the second operating signal receiving unit 411, a second module 410, and a second coupling housing 420. The second operating signal receiving unit 411 may receive the second operating signal OS2 transmitted from the control signal transmitter 210. The second operating signal receiving unit 411 may be, for example, provided inside the second coupling housing 420. The second operating signal receiving unit 411 may be, for example, randomly disposed inside the second coupling housing 420. The second operating signal receiving unit 411 may be included inside the second module 410, but the embodiment is not limited thereto. In another embodiment, the second operating signal receiving unit 411 may be provided spaced apart from the second module 410.

The second module 410 may be, e.g., a speaker, a tuner, a computer, and a charger for an electronic apparatus. Herein, the computer may be, for example, an all-in-one computer or the like. The electronic apparatus may be, for example, a mobile phone, a tablet, and the like. When the second module 410 is the speaker, the audio output unit 224 of the stand 200 may also be omitted. When the second module is the tuner, the tuner 222A of the stand 200 may also be omitted. The second module 410 may be the same as the first module 310, and may also be different therefrom.

The second module 410 may receive a control signal from the stand 200. The second module 410 may receive the control signal from the electric module 220A. The second module 410 may receive the control signal by wire or wirelessly.

In FIGS. 8A and 8B, although it is illustrated that the second module 410 has a curved thick rectangular shape for the convenience of explanation, the second module 410 may be provided in a curved think chip shape. Also, as long as the second module 410 contacts at least a portion of the second coupling housing 420, the second module 410 may be randomly disposed. For example, the second module 410 may be received inside the second coupling housing 420, and may also be provided on the second coupling housing 420. In FIGS. 8A and 8B, it is illustrated that the second module 410 is one member for the convenience of explanation, but the embodiment is not limited thereto. In another embodiment, the second module 410 may be configured with a plurality of members.

The second coupling 420 housing is coupled to the stand housing 220B. The second coupling housing 420 includes a second support part 421 and a fourth coupling part 422. The second support part 421 may contact at least a portion of the second module 410. The second support part 421 may have a curved shape. In FIGS. 8A and 8B, it is exemplarily illustrated that the second support part 421 has a curved rectangular parallelepiped shape, but the embodiment is not limited thereto. In another embodiment, the second support part 421 may have various shapes such as a curved cube, a curved cylinder, and a curved cylindroid.

The fourth coupling part 422 may be protruded from one end of the second support part 421, but the embodiment is not limited thereto. In another embodiment, the fourth coupling part 422 may be recessed from one end of the second support part 421. Herein, the second coupling part 220E may be protruded from one end of the stand part 220C.

The fourth coupling part 422 may be, e.g., a USB connector, a pogo block, and a jig block. However, the fourth coupling part 422 is not particularly limited as long as the fourth coupling part 422 may be coupled to or decoupled from the second coupling part 220E. When the second coupling part 220E is the USB connector, the fourth coupling part 422 may be a corresponding USB connector. For example, when the second coupling part 220E is a USB connection port, the fourth coupling part 422 may be a USB socket to accommodate the USB connection port. When the second coupling part 220E is the pogo block, the fourth coupling part 422 may be a corresponding pogo block. When the second coupling part 220E is the jig block, the fourth coupling part 422 may be a corresponding jig block.

The fourth coupling part 422 may be provided in plurality. In FIGS. 8A and 8B, it is exemplarily illustrated that the fourth coupling part 422 includes two parts, but the embodiment is not limited thereto. The fourth coupling part 422 may include a plurality of, for example, three or more parts. Also, the fourth coupling part 422 may be one part.

The display device 10 according to an embodiment may easily accommodate the display module 100 in the stand 200, and may easily withdraw the display module 100 from the stand 200. Thus, a display module 100 having a generated defect or a stand 200 having a generated defect may be selectively repaired or replaced for use. That is, if a display module and a stand are not separable, a defect generated in one of the display module and the stand devices may require replacement of the whole display device should have been replaced. In contrast, the display device 10 according to an embodiment includes the separable display module 100 and stand 200, so any one of the display module 100 or the stand 200 having a generated defect may be selectively replaced for use.

Further, the display device 10 according to an embodiment includes the first coupling unit 300 and the second coupling unit 400 which are easily coupled to or decoupled from the stand 200. Thus, the stand 200, the first coupling unit 300, or the second coupling unit 400 having a generated defect may be selectively repaired or replaced for use. That is, when a defect is generated, the whole display device should not be replaced, but only any one of the display module 100, the stand 200, or either of the coupling units 300 and 400 having a generated defect therein should be replaced for use.

Further, the display device 10 according to an embodiment includes the first coupling unit 300 and the second coupling unit 400 which may have various functions. A user may selectively couple the first and second coupling units 300 and 400 having required functions to the stand 200 for use on the basis of his (or her) own convenience or preference. Thus, the display device 10 according to an embodiment may perform various functions as a display device, and may enhance conveniences when the user uses the display device.

According to a display device according to an embodiment, slimness of a display device may be realized. According to a display device according to an embodiment, each of a display module, a stand, a first coupling unit, and a second coupling unit may be individually, e.g., separately, managed. According to a display device according to an embodiment, a first coupling unit and a second coupling unit having required functions may be selectively coupled to a stand for use on the basis of convenience or preference of a user.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a curved display module to receive a control signal to display an image, the curved display module including a lower surface;
 a stand including:
  an electric module to provide the control signal, and
  a stand housing having a curved coupling groove, the lower surface of the curved display module being positioned directly on a bottom of the curved coupling groove;
 a first coupling unit including a first module to receive the control signal and driven by the control signal, and a first coupling housing coupled to the stand housing; and
 a second coupling unit including a second module to receive the control signal and driven by the control signal, and a second coupling housing coupled to the stand housing.

2. The display device as claimed in claim 1, wherein the curved coupling groove holds the curved display module in the stand in a first mode, and the curved display module is removable from the stand in a second mode.

3. The display device as claimed in claim 1, wherein:
 the first coupling unit and the stand are coupled to each other in a first coupling mode, and the first coupling unit and the stand are decoupled from each other in a first decoupling mode, and
 the stand housing includes at least one lateral surface that curves along the curved coupling groove, the first coupling housing being curved along the lateral surface of the stand housing and being coupled to the lateral surface of the stand housing in the first coupling mode.

4. The display device as claimed in claim 3, wherein:
 the second coupling unit and the stand are coupled to each other in a second coupling mode, and the second coupling unit and the stand are decoupled from each other in a second decoupling mode, and
 in the second coupling mode, the second coupling housing is stacked on a top surface of the stand, a lateral surface of the second coupling housing being aligned with a curved inner sidewall of the curved coupling groove to face a surface of the curved display module.

5. The display device as claimed in claim 1, wherein each of the first and second modules is one of a speaker, a tuner, a computer, and a charger of an electronic device.

6. The display device as claimed in claim 1, wherein each of the first and second modules receives the control signal by wire or wirelessly.

7. The display device as claimed in claim 1, wherein the stand housing includes:
 a stand part having the curved coupling groove;
 a first coupling part coupled to the first coupling unit; and
 a second coupling part coupled to the second coupling unit, the first and second coupling parts being on opposite sides of the coupling groove.

8. The display device as claimed in claim 7, wherein each of the first and second coupling units is one of a USB connector, a pogo block, and a jig block.

9. The display device as claimed in claim 7, wherein the stand part includes:
 a bottom part;
 a first sidewall part connected to the bottom part; and
 a second sidewall part connected to the bottom part and spaced apart from the first sidewall part,
 wherein the curved coupling groove is defined by an upper surface of the bottom part, an inner surface of the first sidewall part, and an inner surface of the second sidewall part.

10. The display device as claimed in claim 7, wherein the first coupling housing includes:
 a first support part contacting at least a portion of the first module; and
 a third coupling part coupled to the first coupling unit.

11. The display device as claimed in claim 10, wherein the third coupling part is one of a USB connector, a pogo block, and a jig block.

12. The display device as claimed in claim 7, wherein the second coupling housing includes:
 a second support part contacting at least a portion of the second module; and
 a fourth coupling part coupled to the second coupling part.

13. The display device as claimed in claim 12, wherein the fourth coupling part is one of a USB connector, a pogo block, and a jig block.

14. The display device as claimed in claim 1, wherein the curved display module includes:
 a display panel to display an image; and
 a frame surrounding the display panel and having a portion accommodated in the curved coupling groove.

15. The display device as claimed in claim 1, wherein the display module includes an image signal receiving unit to receive an image signal, and the stand includes an image signal transmitter to provide the image signal.

16. A display device, comprising:
 a curved display module to receive a control signal to display an image;
 a stand including:
  a stand part including a curved coupling groove, a bottom of the curved display module being positioned inside the curved coupling groove,
  a first coupling part at a first end of the stand part,
  a second coupling part at a second end of the stand part, and
  an electric module embedded in the stand to provide the control signal, the electric module and curved coupling groove having a non-overlapping relationship in a top view;
 a first coupling unit including a first module to receive the control signal and driven by the control signal, a first support part contacting at least a portion of the first module, and a third coupling part at one end of the first support part and coupled to the first coupling part; and
 a second coupling unit including a second module to receive the control signal and driven by the control signal, a second support part contacting at least a portion of the second module, and a fourth coupling part provided at one end of the second support part and coupled to the second coupling unit.

17. The display device as claimed in claim 16, wherein a bottom of the curved display module is directly on a bottom of the curved coupling groove in a first mode, and the display module is removable from the stand in a second mode.

18. The display device as claimed in claim 16, wherein the first coupling part and the third coupling part are coupled to each other in a first coupling mode, and the first coupling part and the third coupling part are decoupled from each other in a first decoupling mode.

19. The display device as claimed in claim 18, wherein the second coupling part and the fourth coupling part are coupled to each other in a second coupling mode, and the second coupling part and the fourth coupling part are decoupled from each other in a second decoupling mode.

20. A display device, comprising:
- a curved display module;
- a stand having a curved coupling groove, the curved display module being insertable into the curved coupling groove and held by sidewalls of the curved coupling groove;
- a driver for driving the curved display module embedded in the stand;
- a first coupling unit coupled to or decoupled from a first end of the stand; and
- a second coupling unit coupled to or decoupled from a second end of the stand.

* * * * *